United States Patent
Baldes et al.

(10) Patent No.: US 8,615,386 B2
(45) Date of Patent: Dec. 24, 2013

(54) COMPUTERIZED METHOD FOR LOADING A LOAD CARRIER WITH PACKAGES

(75) Inventors: Lars Baldes, Augsburg (DE); Gerda Ruge, Augsburg (DE); Julian Haselmayr, Augsburg (DE)

(73) Assignee: Kuka Roboter GmbH, Augsburg (DE)

( * ) Notice: Subject to any disclaimer, the term of this patent is extended or adjusted under 35 U.S.C. 154(b) by 852 days.

(21) Appl. No.: 12/715,509

(22) Filed: Mar. 2, 2010

(65) Prior Publication Data

US 2010/0249989 A1    Sep. 30, 2010

(30) Foreign Application Priority Data

Mar. 2, 2009  (DE) .......................... 10 2009 011 296

(51) Int. Cl.
| | |
|---|---|
| G06G 7/48 | (2006.01) |
| G06F 7/00 | (2006.01) |
| G06F 17/50 | (2006.01) |
| B65G 61/00 | (2006.01) |

(52) U.S. Cl.
CPC ............ *G06F 17/5018* (2013.01); *B65G 61/00* (2013.01)
USPC .............................................. 703/7; 700/217

(58) Field of Classification Search
USPC .................. 703/7; 414/21, 801, 802; 700/217
See application file for complete search history.

(56) References Cited

U.S. PATENT DOCUMENTS

| | | | |
|---|---|---|---|
| 5,908,283 A | 6/1999 | Huang et al. | |
| 7,210,894 B2 * | 5/2007 | Huang et al. ................. | 414/801 |

FOREIGN PATENT DOCUMENTS

WO    WO 2008/083936 A1    7/2008

OTHER PUBLICATIONS

Bischoff., "Stability aspects of pallet loading" or Spekturm. Springer-Verlag 1991. p. 189-197.*
Chan et al. "A new heuristic embedded approach for multi-constraint air-cargo loading problem", 2006 IEEE. p. 1165-1170.*
U.S. Appl. No. 12/521,603.

* cited by examiner

*Primary Examiner* — Eunhee Kim
(74) *Attorney, Agent, or Firm* — Schiff Hardin LLP

(57) ABSTRACT

In a computerized method, and a computer-readable medium encoded with programming instructions for implementing the method, multiple layers of packages stacked on a load carrier are virtually constructed in a computer and, for each of the layers, an automatic determination is made with regard to the additive pressure that each layer exerts on the respective layers therebelow in the stack. The packages are organized in the multiple layers in the virtual construction dependent on predetermined constraints for the respective additive pressures, and the virtual construction is made available at an output of the computer in a form allowing the actual loading of the load carrier with the packages to be guided.

13 Claims, 2 Drawing Sheets

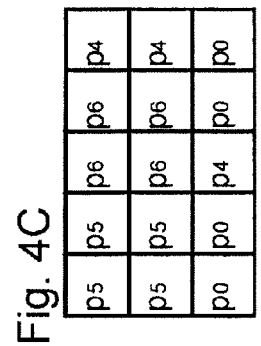
Fig. 2A
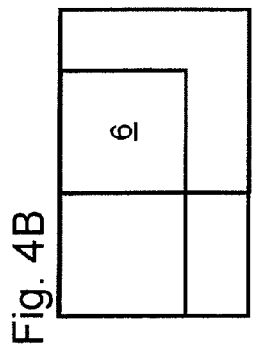
Fig. 2B
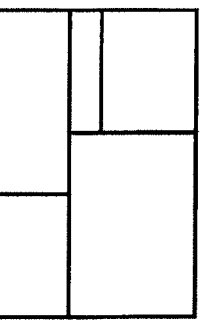
Fig. 2C
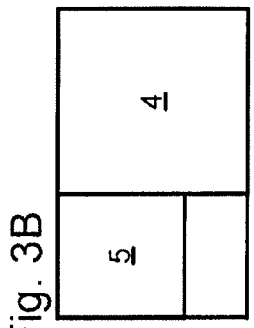
Fig. 3A
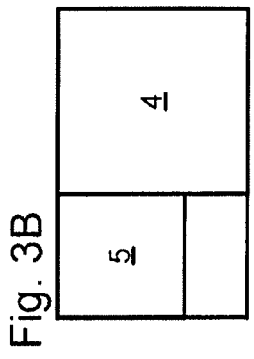
Fig. 3B
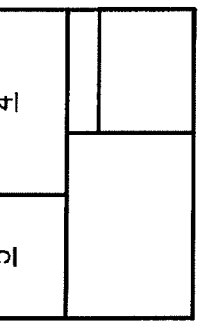
Fig. 3C
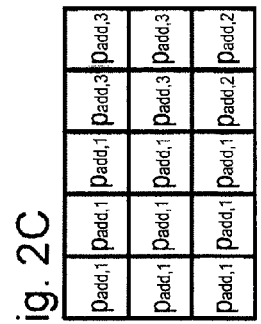
Fig. 4A
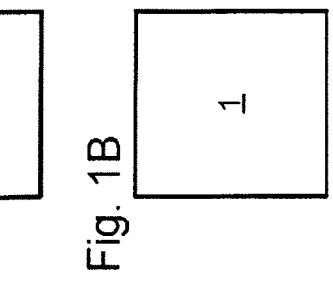
Fig. 4B
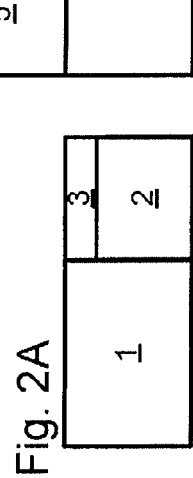
Fig. 4C
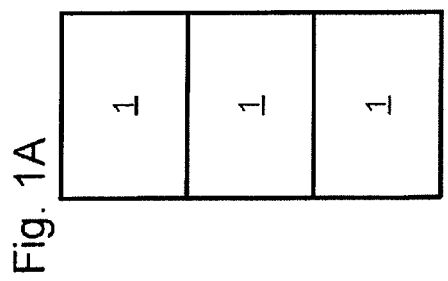
Fig. 1A
Fig. 1B

COMPUTERIZED METHOD FOR LOADING A LOAD CARRIER WITH PACKAGES

BACKGROUND OF THE INVENTION

1. Field of the Invention

The present invention concerns a method and a device for planning the automated loading of a load carrier (in particular a pallet) with packages.

2. Description of the Prior Art

For example, an automated planning of a palletizing or loading pattern (i.e. an arrangement of packages on a load carrier) is known from EP 1 211 203 B1. "Packages" as used herein designates individual goods or goods bundles in general, in particular those transported by manipulators.

DE 10 2007 001 263 A1 discloses a method for checking such palletizing patterns with regard to the stability of the package stack, i.e. the packages arranged on the load carrier, by constructing virtual package layers and determining characteristic values for these virtual package layers.

In order to avoid damaging packages and a collapse of the package stack, it is known in practice to classify the packages that are to be placed into ranking classes that enable a rule-based generation of the package stack. For example, higher classes are assigned to more stable packages and lower classes are assigned to softer or more fragile packages. An overloading can be prevented by a rule that, for instance, prevents the arrangement of packages of higher classification on packages of lower classification.

Due to the number of packages to be classified and rules to be mapped, not only is this method complicated and difficult to implement and handle in terms of calculation, but also often lead to more disadvantageous, in particular less overbuilt and not very densely packaged, package stacks in which packages are barely staggered with one another.

SUMMARY OF THE INVENTION

It is therefore the object of the present invention to improve the load of a load carrier with packages, in particular to improve automated loading of the load carrier by a manipulator.

The above object is achieved in accordance with the present invention by a computerized method for determining loading of packages in multiple layers in a stack on a load carrier that includes the steps of, in the processor, virtually constructing layers of packages to be stacked on a load carrier and, for each layer, automatically determining, in the processor, an additive pressure that each layer exerts on the layer or layers therebelow in the stack.

The above object also is achieved in accordance with the present invention by a non-transitory computer-readable medium that is loaded into a computer and that is encoded with programming instructions that cause the computer to implement a method as described above.

The invention is particularly suitable for the mixed loading of a load carrier with packages of different types, and is based on the principle to determine pressures that can be added in a virtual construction of a package stack that may be impressed on one or more layers or individual packages.

Such pressures that can be added can be determined on the basis of maximum allowable pressures for packages that can advantageously be determined on the basis of a homogeneously filled or populated, in particular densely or most densely packed, package stack. Allowable or optimal loading patterns are frequently known for homogeneous package stacks or are simple to determine empirically or by calculation. The pressure acting on the lowermost layer as a maximum allowable pressure for packages of the types of the stack can be estimated based on measurements of such a homogeneous package stack, in particular its loading area or the contact area of said lowermost layer, its maximum stack height and its maximum load weight, which enables a particularly simple and reliable determination of a maximum allowable pressure as an initial value for pressures that can be added.

Such an estimated pressure that can be added to the lowermost layer can be propagated from bottom to top in a heuristic manner in the virtual construction of package layers, for example by pressures that can be added being propagated on the basis of weights or weight proportions of virtually placed packages. With every package or every package layer, the addable pressure of the already-present packages or package layers that may still be added to this before maximum allowable pressures are reached is thus reduced. Addable pressures can be propagated per region (in particular in regions of a discretized loading area of the load carrier, a discretized footprint of a lowermost layer or a discretized contact area of the lowermost layer with a layer resting on it), per package for some or all already-loaded packages, and/or per layer for one or more layers of the virtual package stack.

A layer or a multi-layer configuration can be virtually constructed and checked via this heuristic. Configurations in which addable pressures are exceeded by packages to be added can thereby be discarded (not used), and thus a reliable or optimal configuration can be found iteratively. In addition to such a binary decision, however, the addable pressures can also be accounted for otherwise in the planning (for example as a quality criterion). For example, an optimizer can prefer configurations that exhibit higher minimum or average addable pressures. Such optimizers can in particular use classical optimization methods such as an SQP method, a Bellmann optimization with forward-backward recursions, evolutionary algorithms or a simulated annealing. A neural network can also generate a suitable loading under consideration of the pressures that can be added.

Additionally or alternatively, in the virtual construction pressures of packages on underlying package layers can be propagated from top to bottom and be compared with maximum allowable pressures for packages in a different heuristic. Weights of packages can thereby advantageously be distributed proportional to their respective contact areas on underlying packages or, respectively, package layers.

Particularly in order to protect more sensitive packages, a maximum stack height, empirically or computationally determined for homogeneous package stacks can be reduced to determine the maximum allowable pressure according to the present invention. In this way it is ensured that such packages are not subjected to the pressure occurring in a densely packed, homogeneous stack.

BRIEF DESCRIPTION OF THE DRAWINGS

FIG. 1A shows a homogeneous package stack in side view.
FIG. 1B is a plan view of the stack of FIG. 1A from above.
FIG. 2A shows a virtual package stack during a step of a method according to an embodiment of the present invention.
FIG. 2B is plan view of the stack of FIG. 2A from above.
FIG. 2C illustrates pressures that can be added per region for the packages of the stack of FIG. 2B.
FIG. 3A shows the package stack of FIG. 2A during a further step of the method.
FIG. 3B is a plan view of the stack of FIG. 3A from above.

FIG. 3C illustrates the pressures that can be added per region, propagated from bottom to top.

FIG. 4A shows the package stack of FIG. 3A during a further step of the method.

FIG. 4B is a plan view of the stack of FIG. 4A from above.

FIG. 4C illustrates pressures propagated per region from top to bottom.

DESCRIPTION OF THE PREFERRED EMBODIMENTS

Figure 5:
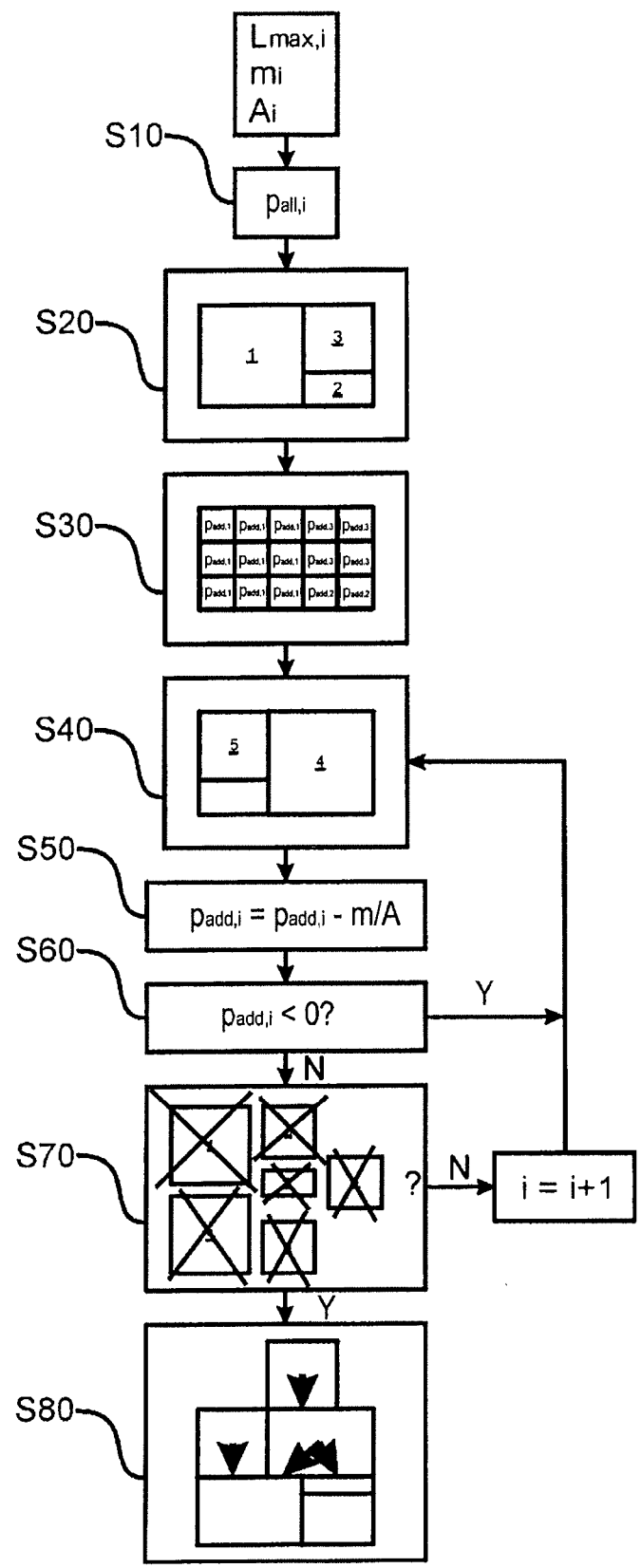
FIG. 5 is a flowchart of an embodiment of the method according to the invention.

FIG. 5 shows a flowchart of an iterative generation in a computer (processor) of an allowable package stack composed of 6 packages 1, ..., 6 according to an embodiment of the present invention, under consideration of maximum allowable pressures on packages. Such a computer can be programmed to execute the steps shown in FIG. 5 by a non-transitory computer-readable medium that is loaded into (stored in) the computer, and that is encoded with programming instructions that cause the computer to execute the steps of FIG. 5.

First, the maximum allowable pressure $p_{all}$ that may act on the packages to be consigned is estimated in a first Step S10.

For this purpose, for each package type a homogeneous pallet of this package type forms the base on which packages are palletized in the densest packing up to a then-maximum allowable stack height. FIGS. 1A, 1B show in side view and plan view from above such a pallet as an example in which identical packages 1 are stacked up to their maximum stack height of three layers. In general, the maximum allowable pressure $p_{all,i}$ on packages of type i results as $$p_{all,i} = \frac{\sum_{j=2}^{L_{max,i}} N_{i,j} \cdot m_i}{N_{i,1} \cdot A_i} \quad (1)$$

with the maximum allowable layer number $L_{max,i}$, the weight $m_i$ of a package, the number of packages in the layer j, and the contact area $A_i$ of a package at the layer resting on it.

If, given the densest packing, all layers contain the same number of packages, (1) simplifies to $$p_{all,i} = \frac{(L_{max,i} - 1) \cdot m_i}{A_i} \quad (1')$$

In order to protect specific package types, a user can reduce the maximum allowable layer number $L_{max,i}$ so that a lower maximum allowable pressure results for these packages.

The pallet is now virtually loaded in layers by a palletizing algorithm, as is shown in the figure sequence FIGS. 2A, 2B, 2C→FIGS. 3A, 3B, 3C→FIGS. 4A, 4B, 4C. Corresponding to FIGS. 1A, 1B, FIGS. 2A, 3A, 4A thereby show a side view of the package stack, FIGS. 2B, 3B, 4B a plan view of the package stack.

In Step S20 a package 1 of the package type 1 explained in the preceding, an equally high package 3 with smaller length and width, and a lower package 2 with again smaller width are arranged in the lowermost, first layer (FIGS. 2A, 2B). The arrangement of the packages in a layer can ensue in a known manner via suitable algorithms in that, for example, largest or heaviest packages are selected first and the layer is successively filled with smaller packages or (optimally) with packages of identical height. The stability of the constructed package stack is thereby advantageously also taken into account.

In Step S30, the pressure $P_{add}$ is now determined that may still be added without exceeding the maximum allowable pressure $p_{all,i}$ of the packages 1, 2, 3 of this layer. This pressure $p_{add}$ that can still be added is own in FIG. 2C; it varies corresponding to the maximum allowable pressures of the three different package types or, respectively, varieties. In the exemplary embodiment, it is equidistantly discretized and accordingly exhibits the values $P_{add,1} = p_{all,1}$ $P_{add,2} = p_{all,2}$ $P_{add,3} = p_{all,3}$ If additional packages 4, 5 whose type corresponds to the packages 1 or 3 should now be arranged in a second layer (FIGS. 3A, 3B), it can initially be checked whether the addable pressure $p_{add}$ on the lowermost layer is hereby exceeded. For example, for this the addable pressure for the second layer is determined in that the packages 4, 5 in the configuration to be checked are initially virtually arranged on the first layer, and then in Step S50 the weight of these packages is divided by their maximum contact area or, respectively, underside A* or by their footprint on the lowermost layer and subtracted per region from the respective addable pressure of the lowermost layer, i.e. in the respective contact region:

$$p_{add,4} = p_{add,3} - \frac{m_4}{A_4^*}$$

$$p_{add,5} = p_{add,1} - \frac{m_5}{A_5^*}$$

$$p_{add,6} = p_{add,1} - \frac{m_4}{A_4^*}$$

$$p_{add,7} = p_{add,1} \cdot k$$

Or, simplified (for example per layer), the largest of the quotients $m_4/A_4$, $m_5/A_5$ is subtracted from the smallest addable pressure of the lower layer:

$$p_{add,45} = \text{Min}\left(p_{add,i} - \text{Max}\left(\frac{m_4}{A_4^*}, \frac{m_5}{A_5^*}\right)\right), i = 1, \ldots 4$$

wherein $p_{add,4}, \ldots, p_{add,7}$ designates an addable region defined per region, $p_{add,45}$ an addable pressure defined per layer for the second layer, and $A^*_j$ a maximum contact layer of the package j or the contact area of said package j in the tested configuration.

It can be seen in FIGS. 3A, 3B that the lower package 2 in the tested configuration is overbuilt with the package 4, and therefore is not loaded by additional layers. In this region the maximum allowable pressure $p_{all,1}$ of the package 4 (which corresponds to the package 1 and is supported on the additional layer) thus defines the addable pressure $p_{all,7}$ that, however, is reduced by a factor of 0<k<1 due to the shear load in the absence of support on the underside in this region.

If the addable pressure for the second layer falls is found in Step S60 to be below a lower limit value (in particular zero) at least per region (as indicated by γ), this shows an overloading of a package of the lowermost layer; the checked configuration is discarded in Step S60 and the Steps S40, S50 are possibly repeated with a different configuration.

If the check in Step S60 indicates "No" (N), additional layers are checked in an analogous manner in Step S70, wherein the pressure that is still to be added is further reduced per region or per layer corresponding to the added layers, and thus is propagated from bottom to top through the package being constructed.

A third layer composed of an additional package 6 that corresponds to the packages 3, 5 is shown as an example in FIGS. 4A, 4B, 4C.

If the pallet is virtually completely constructed (S70: "Y"), the pressure distribution is checked again in Step S80. For example, for this the weight forces m of the individual packages 1, . . . , 6 are distributed proportional to their contact areas, these pressures p are propagated downward through the package stack and are compared with the respective maximum allowable pressures of the loaded packages. In the exemplary embodiment it is correspondingly checked per region:

$$p_{all,1} > p_0 = 0 ? \quad (1)$$

$$p_{all,1} > p_4 = \frac{m_4}{\frac{7}{9}A_4^*} ? \quad (2)$$

$$p_{all,1} > p_5 = \frac{m_5}{A_5^*} ? \quad (3)$$

$$p_{all,1} > p_6 = \frac{m_4}{\frac{7}{9}A_4^*} + \frac{m_6}{A_6^*} ? \quad (4)$$

$$p_{all,2} > p_0 ? \quad (5)$$

$$p_{all,3} > p_4 ? \quad (6)$$

$$p_{all,3} > p_6 ? \quad (7)$$

The first and fifth lines result from the unloaded left, forward corner of the package 1 or, respectively, the overbuilt, unloaded package 3 and can be omitted. The second and sixth line result from the partial seating of the package 4 on the package 1 at its right forward corner and on the package 3 at its right rear corner; the third line results from the homogeneous placement of the package 5 on the package 1; and the fourth and seventh line result from the seating of the package 6 and the partial placement of the package 4 on packages 1, 3.

If it turns out in this check that a maximum allowable pressure is exceeded, the tested configuration is likewise discarded.

Because this check is taken into account in the planning of loading a pallet (i.e. the generation of a palletizing pattern), stable pallets can be planned simply, efficiently and reliably.

Although modifications and changes may be suggested by those skilled in the art, it is the intention of the inventors to embody within the patent warranted hereon all changes and modifications as reasonably and properly come within the scope of their contribution to the art.

We claim as our invention:

1. A computerized method for determining loading of packages in respective multiple layers in a stack on a load carrier, said method comprising the steps of:
   in a processor, virtually constructing multiple layers of packages stacked on a load carrier;
   for each of said layers, automatically determining, in said processor, an added pressure that each layer exerts on the respective layers therebelow in the stack;
   organizing said packages in said multiple layers in said virtual construction dependent on predetermined constraints for the respective added pressures; and
   making said virtual construction available at an output of the processor in a form for guiding actual loading of said load carrier with said packages.

2. A method according to claim 1 comprising determining said added pressures ($p_{add,i}$) as maximum allowable pressures ($p_{all,i}$) for said packages.

3. A method according to claim 2 comprising determining a maximum allowable pressure ($p_{all,i}$) for each package based on a homogeneously filled stack of said packages in said multiple layers.

4. A method according to claim 3 comprising determining the maximum allowable pressure ($p_{all,i}$) based on dimensions of the homogeneously filled stack, a maximum stack height thereof and a maximum load weight thereof.

5. A method according to claim 4 comprising determining the maximum allowable pressure ($p_{all,i}$) is determined according to $$p_{all,i} = \frac{\sum_{j=2}^{L_{max,i}} N_{i,j} \cdot m_i}{N_{i,1} \cdot A_i},$$

wherein $L_{max,i}$ designates a maximum allowable layer number, $m_i$ designates a weight of a package, $N_{i,j}$ designates a number of packages in a layer j, and $A_i$ designates a contact area of a package of a lowermost layer with a layer overlying said lowermost layer.

6. A method according to claim 4 comprising determining the maximum allowable pressure ($p_{all,i}$) is determined according to $$p_{all,i} = \frac{(L_{max,i} - 1) \cdot m_i}{A_i},$$

wherein $L_{max,i}$ designates a maximum allowable layer number, $m_i$ designates a weight of a package, $N_{i,j}$ designates a number of packages in a layer j, and $A_i$ designates a contact area of a package of a lowermost layer with a layer overlying said lowermost layer.

7. A method according to claim 4 comprising reducing a maximum stack height in said virtual construction to determine the maximum allowable pressure.

8. A method according to claim 1 comprising propagating said addable pressures ($p_{add,i}$) from bottom to top of said stack in the virtual construction of package layers.

9. A method according to claim 8 comprising propagating said addable pressures based on weights or weight proportions of virtually placed packages in said stack.

10. A method according to claim 1 comprising determining addable pressures on a basis selected from the group consisting of per region of said stack, per package, and per layer.

11. A method according to claim 1 constructing said virtual construction iteratively and, for each iteration, checking whether permissible addable pressures ($p_{add,i}$) exceeded.

12. A method according to claim 1 comprising comparing pressures of packages on underlying package layers propagated from top to bottom in the virtual construction, with maximum allowable pressures ($p_{all,i}$) for said packages.

13. A non-transitory computer-readable medium encoded with programming instructions that, when loaded into a computer, cause said computer to:
- virtually construct multiple layers of packages stacked on a load carrier;
- for each of said layers, automatically determine an added pressure that each layer exerts on the respective layers therebelow in the stack;
- organize said packages in said multiple layers in said virtual construction dependent on predetermined constraints for the respective added pressures; and
- make said virtual construction available at an output of the computer in a form for guiding actual loading of said load carrier with said packages.

* * * * *